United States Patent
Grannen et al.

(10) Patent No.: US 9,209,776 B2
(45) Date of Patent: Dec. 8, 2015

(54) METHOD OF MANUFACTURING AN ELECTRICAL RESONATOR

(75) Inventors: Kevin J. Grannen, Thornton, CO (US); Carrie A. Rogers, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1501 days.

(21) Appl. No.: 12/494,886

(22) Filed: Jun. 30, 2009

(65) Prior Publication Data
US 2010/0327701 A1  Dec. 30, 2010

(51) Int. Cl.
| | |
|---|---|
| H04R 31/00 | (2006.01) |
| H03H 9/02 | (2006.01) |
| H03H 3/04 | (2006.01) |
| H03H 9/17 | (2006.01) |
| H03H 9/58 | (2006.01) |
| H03H 3/02 | (2006.01) |

(52) U.S. Cl.
CPC .......... *H03H 9/02102* (2013.01); *H03H 3/04* (2013.01); *H03H 9/173* (2013.01); *H03H 9/583* (2013.01); *H03H 9/587* (2013.01); *H03H 2003/021* (2013.01); *H03H 2003/0407* (2013.01); *H03H 2003/0442* (2013.01); *Y10T 29/42* (2015.01)

(58) Field of Classification Search
CPC ....... H03H 3/04; H03H 3/10; H03H 9/02102; H03H 9/173; H03H 9/583; H03H 9/587
USPC ............. 29/592.1, 594, 595, 609.1, 831, 846; 310/363, 364; 333/186–189
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,384,697 B1 | 5/2002 | Ruby | |
| 6,507,983 B1 | 1/2003 | Ruby et al. | |
| 6,828,713 B2 | 12/2004 | Bradley et al. | |
| 6,930,058 B2 | 8/2005 | Hill et al. | |
| 7,033,945 B2 * | 4/2006 | Byun et al. | 438/700 |
| 7,275,292 B2 | 10/2007 | Ruby et al. | |
| 7,304,412 B2 * | 12/2007 | Philliber | 310/324 |
| 7,345,410 B2 | 3/2008 | Grannen et al. | |
| 7,479,685 B2 * | 1/2009 | Fazzio et al. | 257/416 |
| 7,561,009 B2 * | 7/2009 | Larson et al. | 333/187 |
| 7,868,522 B2 * | 1/2011 | Ruby | 310/346 |
| 2006/0103492 A1 | 5/2006 | Feng et al. | |
| 2007/0205850 A1 | 9/2007 | Jamneala et al. | |

(Continued)

FOREIGN PATENT DOCUMENTS

JP  58156220  9/1983

OTHER PUBLICATIONS

Melamud, et al., "Temperature Compensated High Stability Silicon Resonators", Applied Physics Letters, Jun. 14, 2007, vol. 90, Issue 24.

(Continued)

*Primary Examiner* — Paul D Kim

(57) ABSTRACT

An electrical resonator comprises a substrate comprising a cavity. The electrical resonator comprises a resonator stack suspended over the cavity. The resonator stack comprises a first electrode; a second electrode; a piezoelectric layer; and a temperature compensating layer comprising borosilicate glass (BSG).

9 Claims, 5 Drawing Sheets

(56) References Cited

U.S. PATENT DOCUMENTS

2008/0204173 A1    8/2008    Melamud et al.
2008/0258842 A1    10/2008   Ruby et al.

OTHER PUBLICATIONS

J. Larson, et al., "Measurement of Effective Kt2, Q, Rp, Rs vs. Temperature for Mo/AlN FBAR Resonators", IEEE Ultrasonics Symposium, 2002, p. 939-943.

J. Larson, et al. "Power Handling and Temperature Coefficient Studies in FBAR Duplexers for the 1900 MHz PCS Band", IEEE Ultrasonics Symposium, 2000, p. 869-874.

K.M. Lakin, et al. "Temperature Compensated Bulk Acoustic Thin Film Resonators", IEEE Ultrasonics Symposium, 2000, p. 855-858.

W.A. Pliskin, "Comparison of Properties of Dielectric Films Deposited by Various Methods", J. Vac. Sci. Technol., Sep./Oct. 1977, vol. 14, No. 5, p. 1064-1081.

W. Kern, et al. "Chemical Vapor Deposition of Silicate Glasses for Use with Silicon Devices", J. Electrochem. Soc., Apr. 1970, vol. 117, No. 4, p. 568-573.

* cited by examiner

METHOD OF MANUFACTURING AN ELECTRICAL RESONATOR

BACKGROUND

In many electronic applications, electrical resonators are required. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

Most FBAR devices have a frequency response having a band pass characteristic characterized by a center frequency. The resonant frequency depends on the materials of the FBAR 'stack' as well as their respective thicknesses. The constituent FBARs have a frequency response characteristic characterized by a resonant frequency. In certain known FBAR devices in which the material of the piezoelectric material is aluminum nitride (AlN) and the material of the electrodes is molybdenum (Mo), the resonant frequency of the FBAR device has a temperature coefficient ranging from approximately −20 ppm/° C. to approximately −35 ppm/° C. Such temperature coefficients reduce the temperature range over which the FBAR device incorporating the FBARs can meet its pass bandwidth specification. Such temperature coefficients additionally reduce manufacturing yield, because the bandwidth limits to which the FBAR devices are tested have to be inset to ensure that the FBAR device will meet its bandwidth specification over its entire operating temperature range.

Illustratively, the change in the temperature coefficient of the constituent materials of the FBAR device can result in a change in the resonant frequency of the FBAR device of several MHz over a typical operating temperature range of −30° C. to +85° C. As should be appreciated, variation in the resonant frequency (also referred to as the frequency shift) with temperature may be so great as to shift the operating frequency of the device outside its desired operating frequency range. For example, if the FBAR device is a component of a signal filter, a change in the resonant frequency could impact the passband of the filter beyond an acceptable limit.

In an effort to reduce the variation of resonant frequency with temperature of FBAR devices, temperature compensation layers have been developed. In certain known FBAR devices, the temperature-compensating element has a temperature coefficient opposite in sign to the temperature coefficient of the piezoelectric element. While some materials are useful in temperature compensation layers, there are drawbacks in their incorporation into fabrication of many FBAR devices.

What are needed, therefore, are an acoustic resonator structure and its method of fabrication that overcome at least the shortcomings of known described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 2A-2E show cross-sectional views of a method of fabricating an FBAR in accordance with an illustrative embodiment.

DEFINED TERMINOLOGY

The terms 'a' or 'an', as used herein are defined as one or more than one.

The term 'plurality' as used herein is defined as two or more than two.

In addition to their ordinary meanings, the terms 'substantial' or 'substantially' mean to with acceptable limits or degree to one having ordinary skill in the art. For example, 'substantially cancelled' means that one skilled in the art would consider the cancellation to be acceptable.

In addition to their ordinary meanings, the terms 'approximately' mean to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Figure 1A:
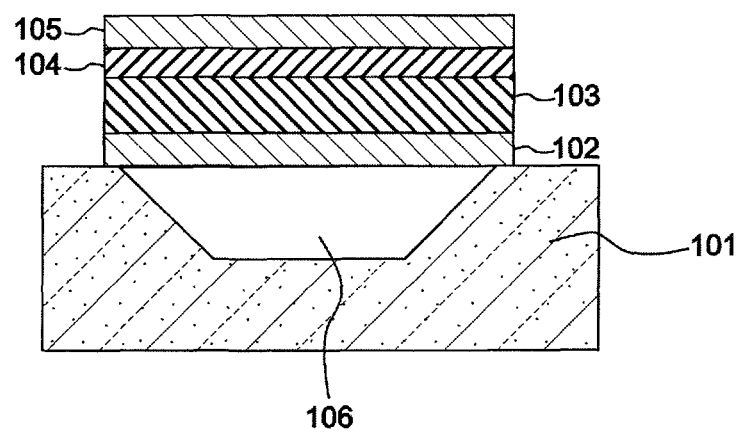
FIG. 1A shows a cross-sectional view of an FBAR in accordance with a representative embodiment.

FIG. 1A is a cross-sectional view of an electrical resonator structure 100 in accordance with an illustrative embodiment. The electrical resonator structure 100 comprises a substrate 101, a first electrode 102 disposed over the substrate 101, a layer of piezoelectric layer 103, a temperature compensation layer 104 and a second electrode 105. The electrical resonator structure 100 also comprises a cavity 106 formed in the substrate 101. With the placement of the first and second electrodes 102, 105, the piezoelectric layer 103 and the temperature compensation layer 104 (collectively referred to as the resonator stack) over the cavity the electrical resonator structure 100 comprises an FBAR structure.

Figure 1B:
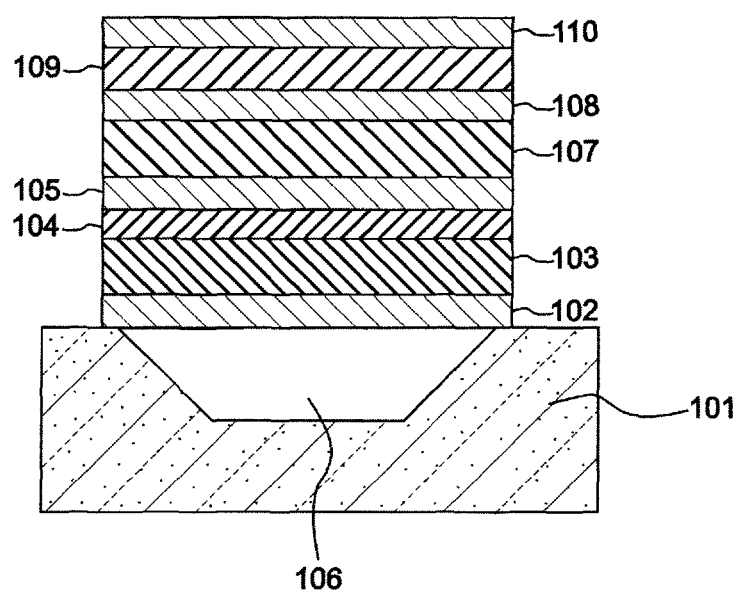
FIG. 1B shows a cross-sectional view of a stacked bulk acoustic resonator in accordance with a representative embodiment.

Notably, more than one resonator stack is contemplated. For example, another resonator stack comprising the first and second electrodes 102, 105, the piezoelectric layer 103 and the temperature compensation layer 104 may be provided over the resonator stack as shown in shown in FIG. 1B. This structure provides a stack bulk acoustic resonator (SBAR). The SBAR is fabricated by repeating the fabrication sequence of the resonator stack after forming the resonator stack shown in FIG. 1A, and before removing sacrificial material as discussed below. In a representative embodiment, the SBAR comprises first electrode 102 disposed over the substrate 101, a layer of piezoelectric layer 103, a temperature compensation layer 104, second electrode 105. Another temperature compensation layer 107 is provided over the second electrode 105. An electrode 108 is provided over the temperature compensation layer 107, and in tandem a second piezoelectric layer 109 and another electrode 110 are provided over the temperature compensation layer.

The placement of the temperature compensation layers 104, 107 between the piezoelectric layer 103 and the second electrode 105 as shown in FIG. 1A is merely illustrative. Furthermore, the placement of the other temperature compensation layer 107 beneath the electrode 108 is also merely illustrative. Notably, the temperature compensation layers 104, 107 may be provided between other layers in the resonator stack. For example, the temperature compensation layer 104 may be provided between the first electrode 102 and the piezoelectric layer 103. Similarly, the other temperature compensation layer 107 may be provided between the electrode 108 and the second piezoelectric layer 109. In accordance with a representative embodiment, the temperature compensation layers 104, 107 each comprise borosilicate glass (BSG) comprising boron in the range of approximately 0.1% to approximately 5.0% where the concentration of boron is either a mass or weight percent or an atomic percent. As described more fully below, BSG comprises a temperature coefficient that is opposite in sign to the temperature coefficient of the piezoelectric material comprising the piezoelectric layer 103, and the second piezoelectric layer 109, in the embodiment comprising an SBAR. More generally, BSG is selected to provide a temperature coefficient that is opposite of the composite temperature coefficient of the other layers of the resonator stack of the FBAR, and of the SBAR.

The doping level of boron in the BSG is selected to provide a suitable degree of temperature compensation while not interfering with thermal constraints in processing the electrical resonator structure 100. As described above, the doping level of boron in the BSG layer comprising the temperature compensation layer 104 is in the range of 0.1% to approximately 5.0% (weight percent or atomic percent). The greater the doping level of boron in the temperature compensation layer 104, the greater the temperature coefficient. However, as the doping level increases, the melting point of BSG decreases. In order to ensure that certain higher temperature processes (e.g., deposition of the piezoelectric layer 103) do not cause flow of the temperature compensation layer 104 comprising the BSG, the doping level is maintained in the range set forth above. As an example, the aluminum nitride is deposited at temperatures that may approach 500° C., a temperature that may cause reflow concerns when using BSG with a high concentration of boron. To prevent this reflow from happening, the concentration of boron is kept low enough to prevent reflow but high enough to enable adequate temperature compensation of the FBAR/SBAR structure.

Figure 2A:
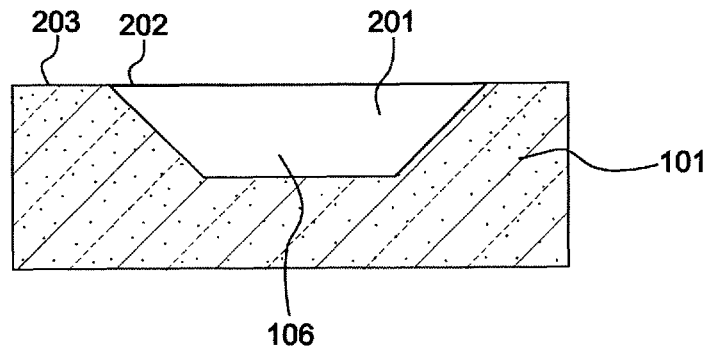

FIG. 2A shows a cross-sectional view of the substrate 101 comprising the cavity 106 formed in the substrate, and substantially filled with a sacrificial material 201. Illustratively, the substrate 101 is silicon (e.g., monocrystalline silicon) and the sacrificial material 201 comprises silicon dioxide doped with phosphorous, and often referred to as phosphosilicate glass (PSG). The formation of the cavity 106 and the filling thereof with sacrificial material 201 are known. For example, the formation of the cavity 106 and the disposition of the sacrificial material 201 therein may be effected as discussed in U.S. Pat. No. 6,384,697 to Ruby, et al., entitled "Cavity Spanning Bottom Electrode of a Substrate-Mounted Bulk Wave Acoustic Resonator." This patent is assigned to the assignee of the present application, and is specifically incorporated herein by reference. After formation of the sacrificial material 201, a chemical mechanical polish step is effected so that a surface 202 of the sacrificial material is substantially flush with a surface 203 of the substrate 101.

Figure 2B:
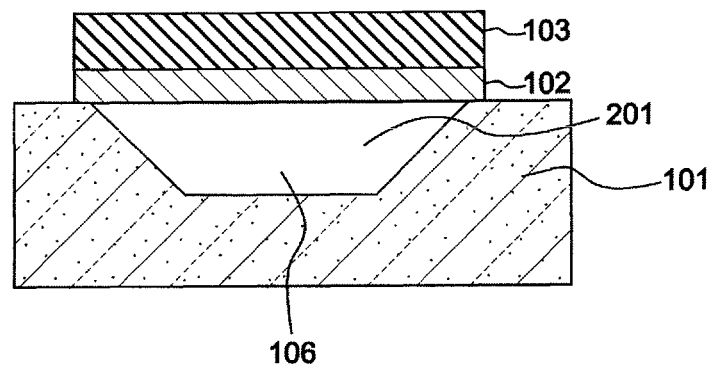

FIG. 2B shows a cross-sectional view of the substrate 101 comprising the sacrificial material 201 after forming of the first electrode 102 and the piezoelectric layer 103. Notably, the first electrode 102 spans cavity 106 and is disposed over surface 202 of the sacrificial material 201 and the surface 203 of the substrate 101.

Figure 2C:
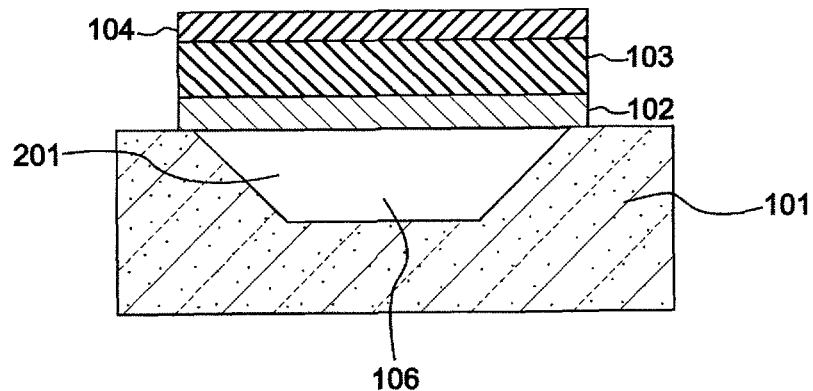

FIG. 2C shows a cross-sectional view of the substrate 101 comprising the sacrificial material 201 after forming of the first electrode 102, the piezoelectric layer 103 and the temperature compensation layer 104. As described above, the temperature compensation layer 104 comprises BSG. The thickness of the layer is selected based on the desired resonance frequency of the resonator structure 100. For example, if the desired resonance frequency if the electrical resonator structure 100 is approximately 1900 MHz, then the temperature compensation layer is deposited at a thickness in the range of approximately 500 Å to 2000 Å. Generally, the thickness of the temperature compensation layer 104 is in the range of approximately 200 Å to approximately 10000 Å.

In accordance with a representative embodiment, the BSG layer of is fabricated using a known and comparatively low temperature plasma enhanced chemical vapor deposition (PECVD) process. Illustratively, the PECVD process is carried out at a temperature in the range of approximately 300° C. to approximately 400° C. Illustratively, the BSG layer by PECVD can include use of helium (0 sccm to 5000 sccm), nitrous oxide (0 sccm to 100 sccm), silane or tetraethylorthosilicate (TEOS)(0 sccm to 50 sccm), and diborane (0 sccm to 50 sccm) at an operating pressure of approximately 0 Torr to approximately 10 Torr at a power of approximately 0 W to approximately 500 W. The temperature of the process is illustratively at approximately 0° C. to approximately 500° C. Alternatively, the temperature compensation layer 104 comprising BSG may be formed using a radio frequency (RF) sputtering of a borosilicate glass target known to one of ordinary skill in the art. Furthermore, a modulation of the boron and nitrogen concentration in the glass ($SiO_2$) in the temperature compensation layer 104 may be effected to provide not only suitable temperature compensation of the resonator stack, but also resistance to HF used in the removal of the sacrificial material 201 in later processing. As should be appreciated by one of ordinary skill in the art, in forming the temperature compensation layers 104, 107 comprising BSG, boron may be incorporated in an atomic form or in a form bonded to the silicon and/or oxygen atoms.

Figure 2D:
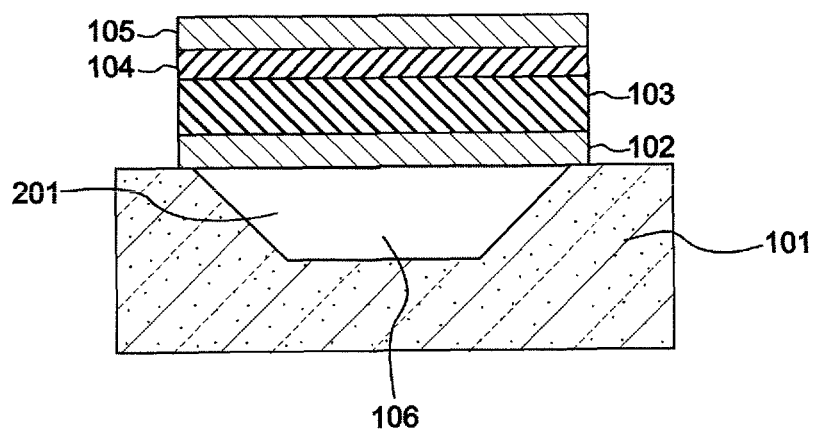

FIG. 2D shows a cross-sectional view of the substrate 101 comprising the sacrificial material 201 after forming of the first electrode 102, the piezoelectric layer 103, the temperature compensation layer 104 and the second electrode. The formation of the first electrode 102 and the piezoelectric layer 103 and the second electrode 105 may be as described, for example, in one or more of the following commonly owned U.S. Pat. Nos. 5,587,620; 5,873,153; 6,384,697; 6,507,983; and 7,275,292 to Ruby, et al.; U.S. Pat. No. 6,828,713 to Bradley, et. al; and commonly owned U.S. Patent Application Publications: 20070205850 to Jamneala, et al.; 20080258842 to Ruby, et al.; and 20060103492 to Feng, et al. The disclosures of these patents and patent application publications are specifically incorporated herein by reference. Notably, the teachings of these patents and patent publications is intended to be illustrative of methods, materials and structures useful to the present teachings, but in no way limiting to the present teachings.

Finally, after forming of the second electrode 105, the sacrificial material 201 is removed using a suitable etchant through a known release process. For example, if the sacrificial material 201 is PSG, an HF solution may be used. After release of the sacrificial material 201, the resonator structure comprising the temperature compensation layer 104, the piezoelectric layer 103 and electrodes 102, 105 over the cavity 106 as shown in FIG. 1 is realized. It is emphasized that the fabrication sequence and the materials and methods are merely illustrative and that other fabrication sequences, materials and methods are contemplated. For example, as described above, the placement of the temperature compensation layer may be other than shown and described, and generally may be placed between any two layers of the resonator stack between the first electrode 102 and the second electrode 105.

Figure 3:
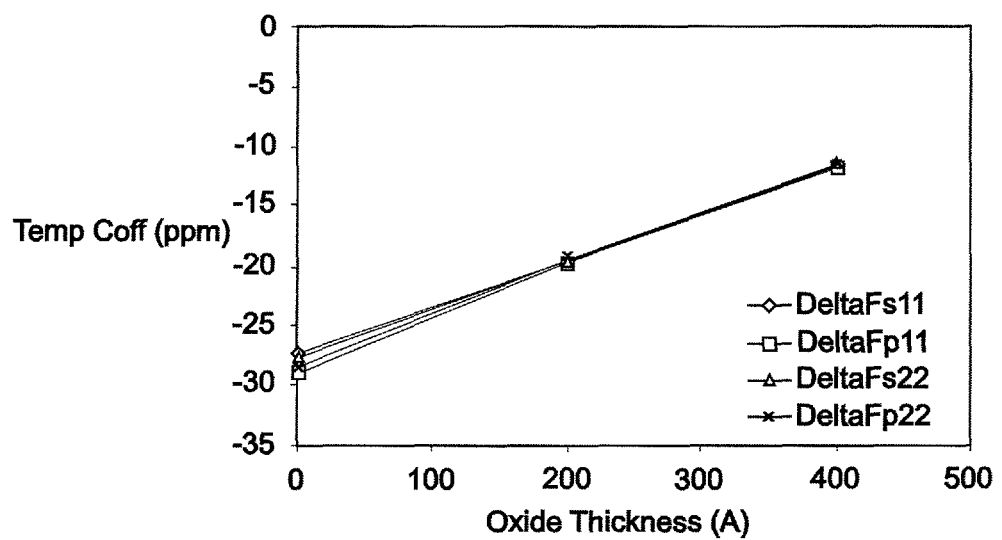
FIG. 3 shows a graph showing the dependence of temperature compensation on BSG thickness.

FIG. 3 shows a graph showing the dependence of temperature compensation on BSG thickness. Notably, the temperature coefficient for the BSG is less than one for the parameters and thicknesses shown.

In accordance with illustrative embodiments, electrical resonators comprising a temperature compensation layer in a resonator stack suspended over a cavity are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of fabricating an electrical resonator, the method comprising:
    forming a cavity in a substrate;
    providing a layer of sacrificial material in the cavity;
    forming a resonator stack over the cavity, the forming of the resonator stack comprising forming a temperature compensation layer comprising borosilicate glass (BSG), wherein a concentration of boron in the BSG layer is in the range of approximately 0.1% to approximately 5.0% atomic mass percentage or weight percentage; and
    removing the sacrificial material from the cavity.

2. The method as claimed in claim 1, wherein the forming the temperature compensation layer comprises forming a mixture of silicon dioxide and boron, and depositing the mixture in a vacuum.

3. The method as claimed in claim 1, further comprising patterning the temperature compensation layer within a boundary of the first electrode or substantially coincident with the boundary.

4. The method as claimed in claim 1, wherein the temperature compensation layer is disposed between a first electrode and a piezoelectric layer of the resonator stack.

5. The method as claimed in claim 1, wherein the temperature compensation layer is disposed between a second electrode and a piezoelectric layer of the resonator stack.

6. The method as claimed in claim 1, wherein the temperature compensation layer is disposed over the substrate and beneath a first electrode of the resonator stack.

7. The method as claimed in claim 1, wherein the temperature compensation layer is disposed over a second electrode of the resonator stack.

8. The method as claimed in claim 1, wherein the temperature compensation layer has a thickness in the range of approximately 500 Å to approximately 2000 Å.

9. The method as claimed in claim 1, wherein the temperature compensation layer has a thickness in the range of approximately 200 Å to approximately 10000 Å.

* * * * *